United States Patent
Kamon et al.

[11] Patent Number: 5,254,418
[45] Date of Patent: Oct. 19, 1993

[54] METHOD OF MANUFACTURING PHOTOMASK

[75] Inventors: Kazuya Kamon; Junji Miyazaki; Hitoshi Nagata, all of Itami, Japan

[73] Assignee: Mitsubishi Denki Kabushiki Kaisha, Tokyo, Japan

[21] Appl. No.: 777,189

[22] Filed: Oct. 16, 1991

[30] Foreign Application Priority Data

Oct. 22, 1990 [JP] Japan .................. 2-285466

[51] Int. Cl.$^5$ .............................................. G03F 9/00
[52] U.S. Cl. ........................................ 430/5; 430/320
[58] Field of Search ................................. 430/5, 320

[56] References Cited

U.S. PATENT DOCUMENTS

5,045,417  9/1991  Okamoto .......................... 430/5
5,100,503  3/1992  Allman et al. ..................... 430/5

Primary Examiner—Marion E. McCamish
Assistant Examiner—Mark A. Chapman
Attorney, Agent, or Firm—Oblon, Spivak, McClelland, Maier & Neustadt

[57] ABSTRACT

A method of manufacturing a photomask, according to the present invention, comprises the step of entirely forming an intermediate shifter on a transparent substrate, light shielding layers and a phase shifter such that the thickness of the intermediate shifter successively varies. In edge portion of the phase shifter, thus, the phase of light is continuosly shifted from 0 to 180 degree. As in result, light intensity at the edge portion does not decrease to zero but has a relatively large value, preventing a bridge to be formed.

7 Claims, 9 Drawing Sheets

METHOD OF MANUFACTURING PHOTOMASK

BACKGROUND OF THE INVENTION

1. Field of the Invention

The present invention is directed to a method of manufacturing a photomask comprising phase shifters.

2. Description of the Prior Art

Figure 1A:
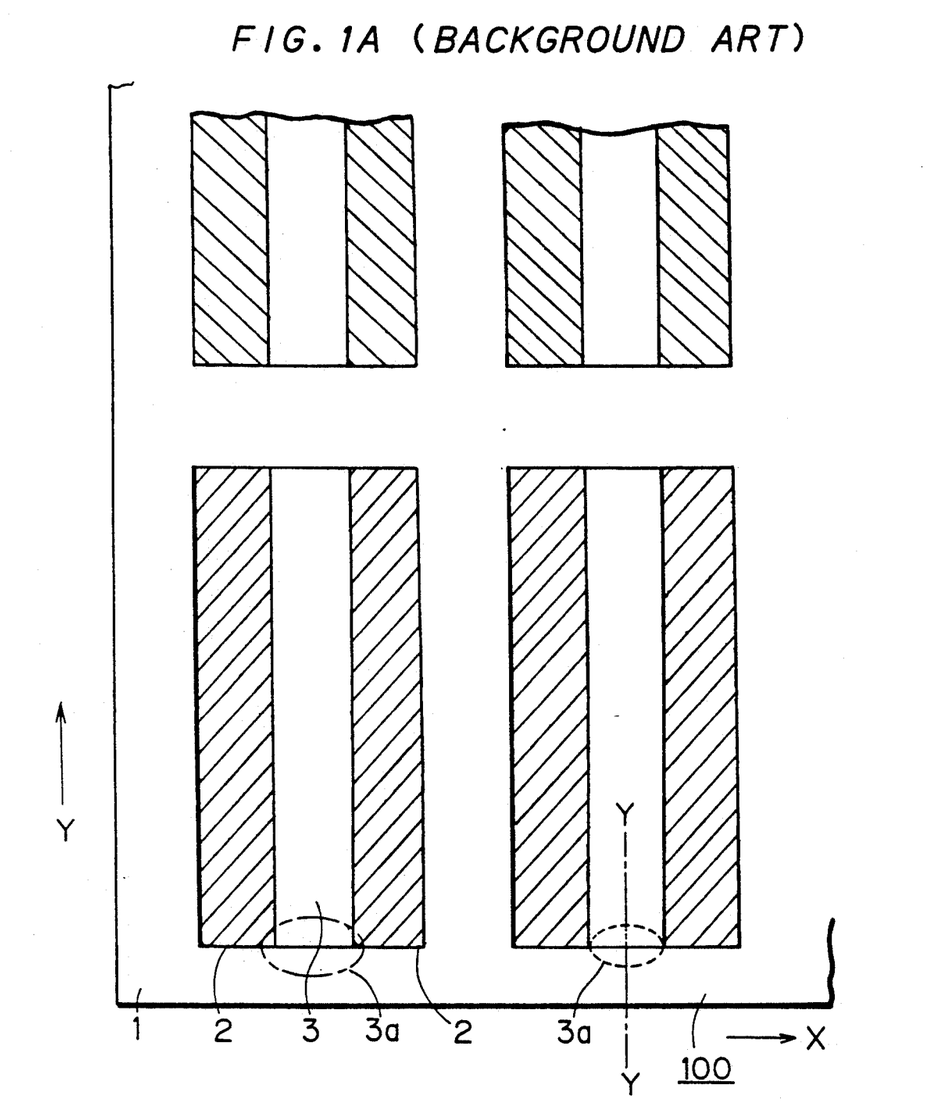
FIGS. 1A and B is a plan view of a conventional photomask.
Figure 1B:
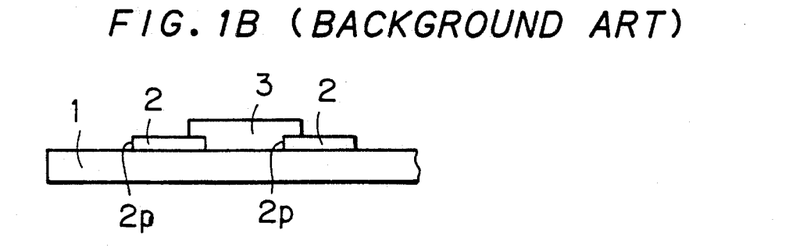

FIGS. 1A and 1B are a plan view and a partial cross sectional view of a conventional photomask 100. In FIGS. 1 and 1B, a transparent substrate 1 is coated with a plurality of light shielding layers 2 each including a light shielding pattern 2p of a predetermined dimension. The light shielding layers 2 are formed on the transparent substrate 1 such that a line-space grating is periodically constituted. Each alternate space between adjacent light shielding layers 2 is filled with a phase shifter 3.

Figure 2:
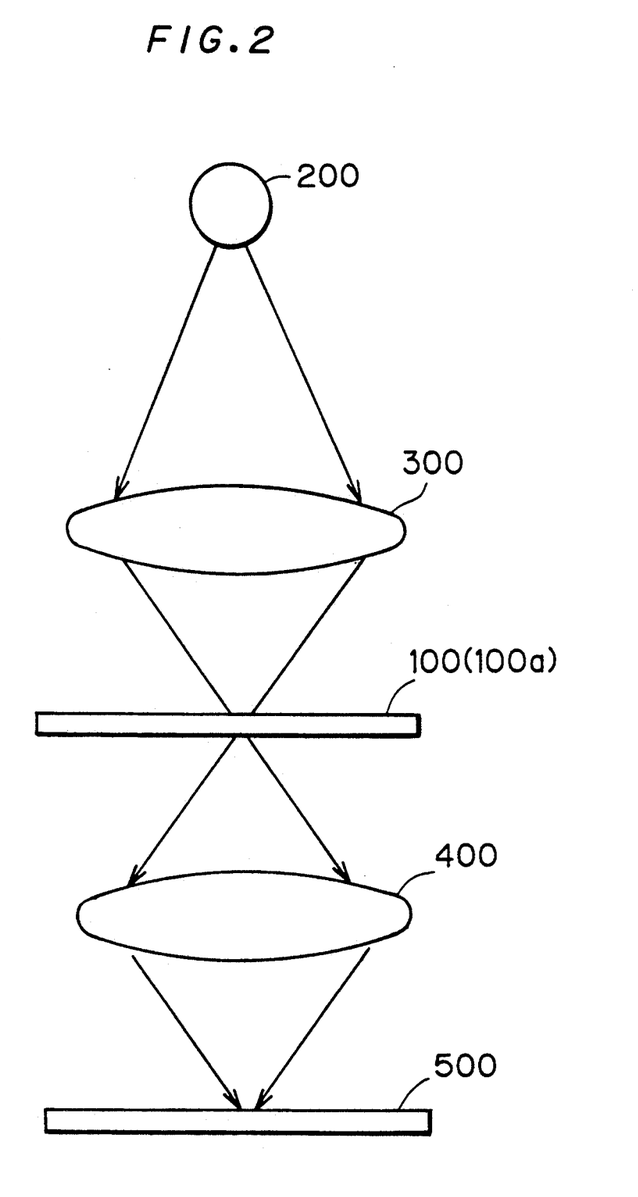
FIG. 2 is a partial cross sectional view of the conventional photomask.

FIG. 2 is a schematic diagram of an exposure device. The exposure device includes a light source 200 for emitting ultraviolet light. Ultraviolet light from the light source 200 impinges on the photomask 100 through a lens 300. The ultraviolet light entering the photomask 100 is partially transmitted through uncoated regions (space regions) while partially blocked by the light shielding layers (line regions) 2. Transmitted light impinges on a wafer 500 through a lens 400.

Now, operation of the photomask 100 will be explained. First, the photomask 100 is mounted to the exposure device of FIG. 2 and the light source 200 is turned on so that ultraviolet light from the light source 200 impinges on the photomask 100 through the lens 300. Since the photomask 100 merely allows partial transmission, the ultraviolet light is present in some area but is not present in other area immediately below the photomask 100. More particularly, it is only in the uncoated regions of the photomask 100 not provided with the patterns 2p where the ultraviolet light is allowed. The phase shifter 3 causes light passing through the same to be phase shifted by 180°. Hence, light passed through both the transparent substrate 1 and the phase shifter 3 is 180° out of phase with light passed only through the transparent substrate 1.

The transmitted light is focused on the wafer 500 by the lens 400. In exposure-regions of the wafer 500 corresponding to the uncoated regions (space regions), the light passed only through the transparent substrate 1 is affected by the light passed through the phase shifter 3. Thus, the light intensity at the centers of the exposure-regions is increased, so that the half-value width is decreased. As a result, images corresponding to the patterns 2b are printed with high resolution on the wafer 500.

Figure 3:
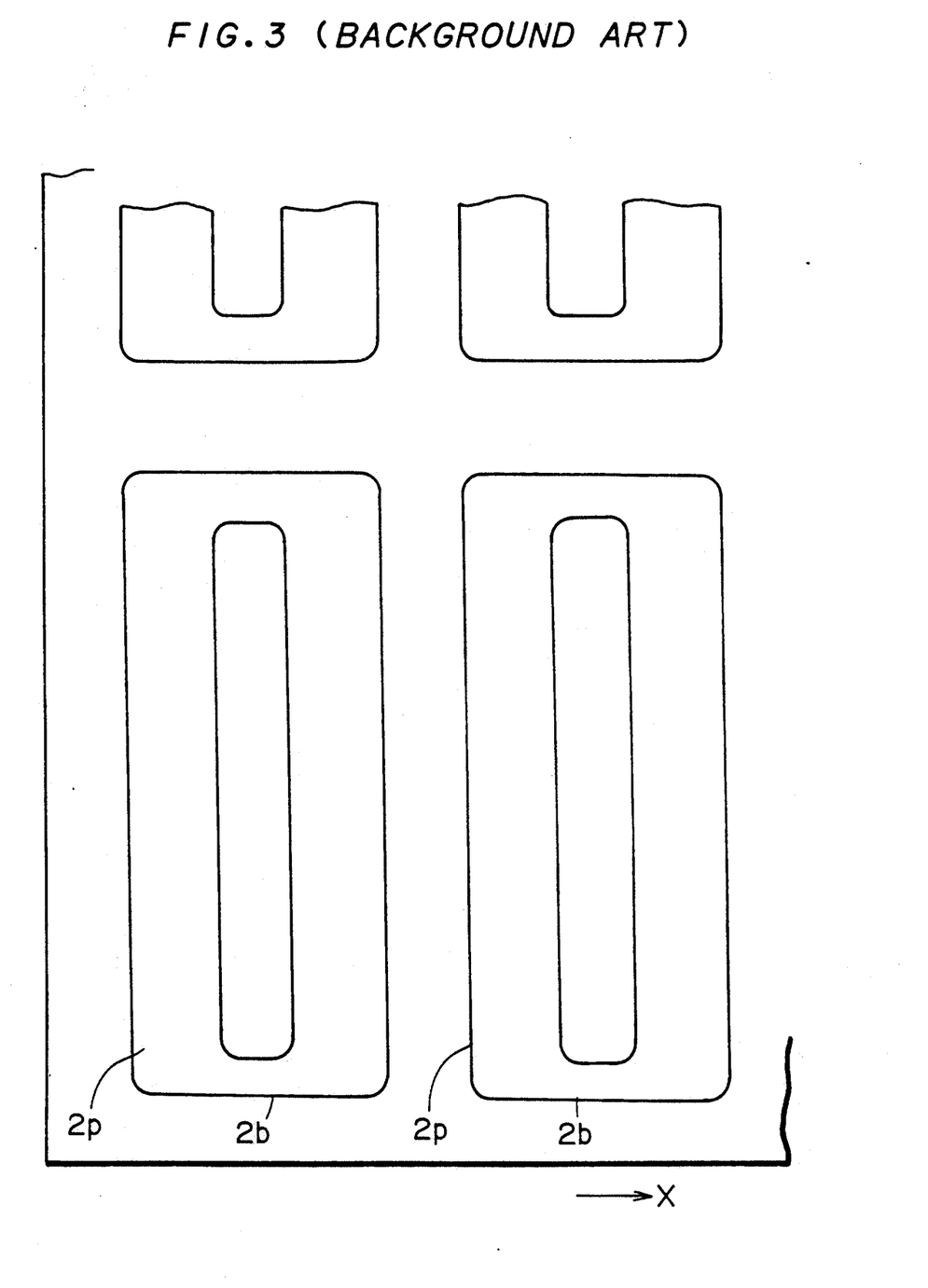
FIG. 3 is a plan view of patterns transmitted onto a wafer by using the conventional photomask.
Figure 4:
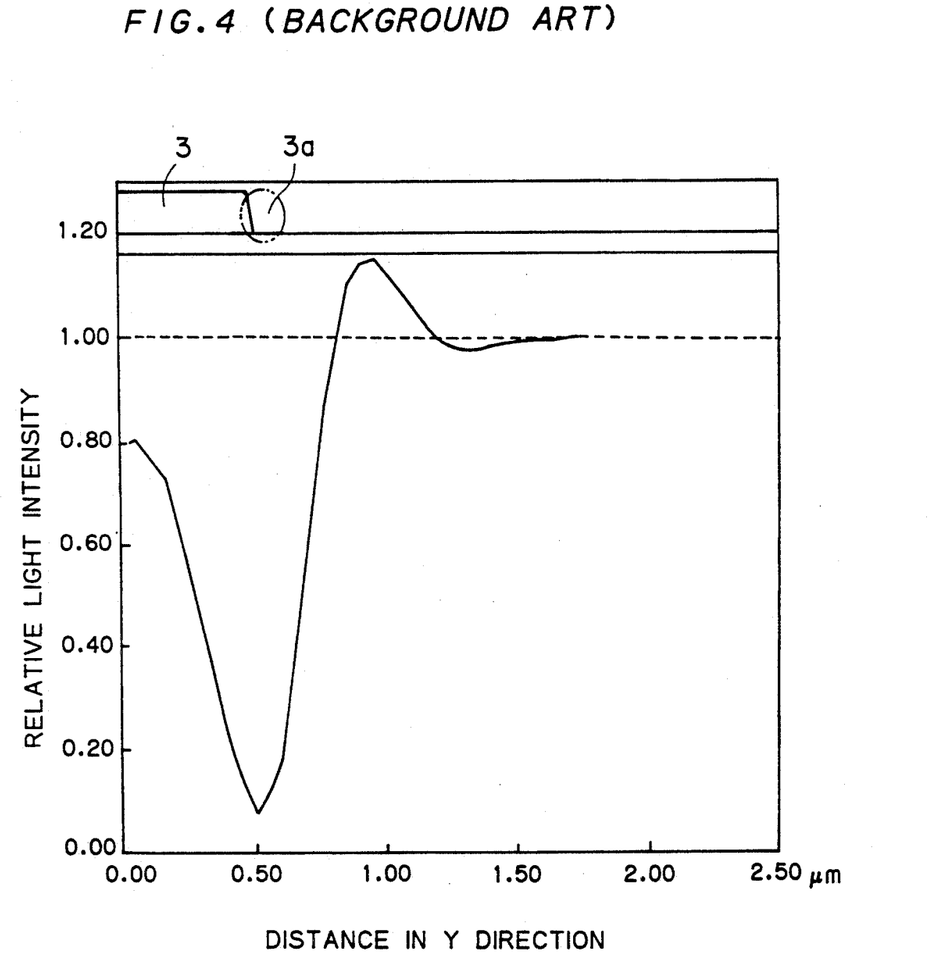
FIG. 4 is a graph showing relative light intensity along the Y—Y line of FIG. 1.

FIG. 3 is a plan view of patterns printed on the wafer 500 in the above manner. It is readily seen that the printed patterns are in desirable condition in regard with X direction. Due to the phase shifter 3 formed along X direction in every other uncoated region (space region), the patterns 2p have good contrast. In regard with Y direction, however, the printed patterns are in an undesirable condition because adjacent patterns 2b are bridged by a bridge 2b. FIG. 4 explains the reason why. In a boundary area 3a, where the edge of the phase shifter 3 meets the transparent substrate 1 with respect to the Y direction, the phases of the abutting regions are opposite. Hence, light intensity is reduced almost to zero on the wafer 500 in a region corresponding to the boundary area 3a.

As heretofore described, pattern printing using the conventional photomask 100 creates a bridge connecting adjacent patterns. Thus, truly desired pattern cannot be obtained by using the conventional photomask 100.

SUMMARY OF THE INVENTION

The present invention is directed to a method of manufacturing a photomask. The method according to the present invention comprises the steps of: (a) preparing a transparent substrate having two major surfaces; (b) selectively coating one major surface of the transparent substrate with two light shielding layers which are separated from each other, to thereby define an uncoated region of the transparent substrate, the uncoated region being between the two light shielding layers; (c) providing a phase shifter on the uncoated region; and (d) entirely forming an intermediate shifter on the transparent substrate, the light shielding layers and the phase shifter such that the thickness of the intermediate shifter successively varies.

According to an aspect of the present invention, the step (c) comprises the steps of: (c-1) providing a silicon dioxide on the transparent substrate and the light shielding layers; (c-2) entirely covering the silicon dioxide with resist film; (c-3) exposing the resist film by electron beam to form an exposed region which corresponds to the shape of the first phase shifter; (c-4) selectively removing the resist film, to thereby form a resist pattern; and (c-5) selectively etching the silicon dioxide film with the resist pattern as a mask, whereby the phase shifter made of silicon dioxide is formed.

Accordingly, an object of the present invention is to offer a method of manufacturing a photomask according to which fine patterns can be printed without degrading resolution.

Another object of the present invention is to offer a method of manufacturing a photomask according to which a bridge between adjacent patterns does not result.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 5A:
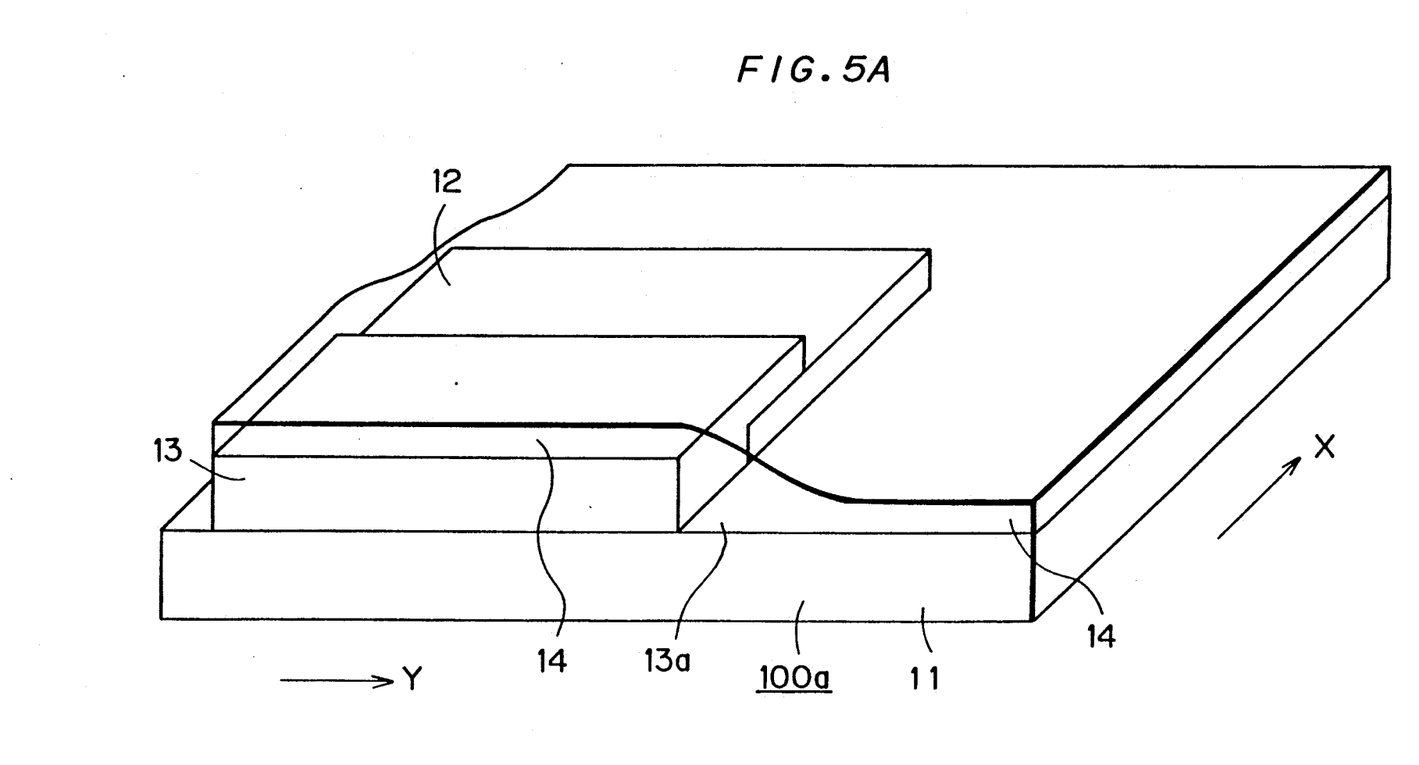
FIG. 5A is a perspective view of a photomask manufactured according to the present invention.
Figure 5B:
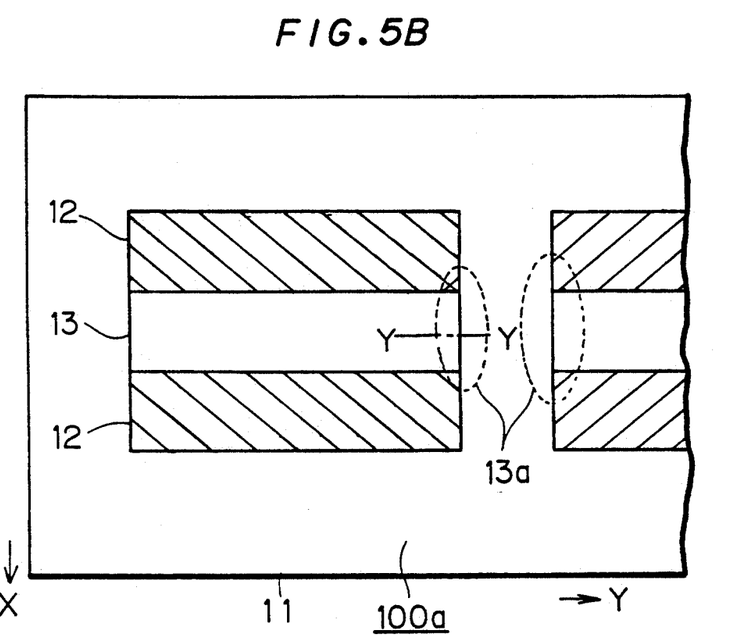
FIG. 5B is a plan view of the photomask of FIG. 5A.
Figure 5C:
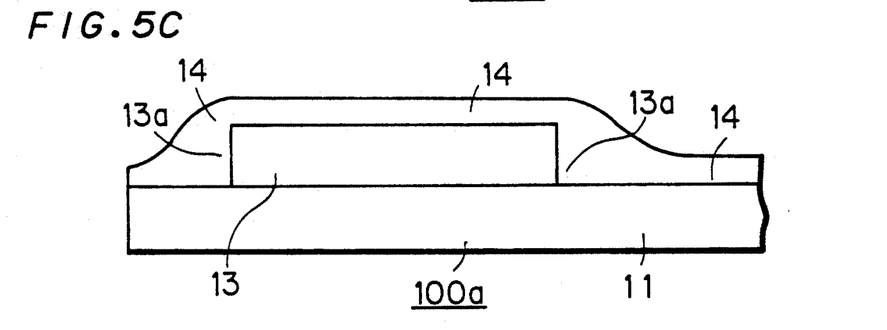
FIG. 5C is a cross sectional view of the photomask of FIG. 5A.

FIG. 5A is a perspective view of a photomask 100a manufactured according to a method of manufacturing a photomask according to an embodiment of the present invention. FIGS. 5B and 5C are a plan view and a cross sectional view of the photomask 100a, respectively. The manufacturing method will be explained in detail later.

The photomask 100a comprises a transparent substrate 11 and a plurality of light shielding layers 12 formed on the transparent substrate 11. The light shielding layer 12 is made of chromium, for example, and has a shape corresponding to a predetermined light shielding pattern 12p. Each alternate space regions between adjacent light shielding layers 12 is filled with a phase shifter 13, the phase shifter 13 being made of silicon dioxide, for example. The transparent substrate 11, the light shielding layer 12 and the phase shifter 13 are covered with an intermediate phase shifter 14. The intermediate phase shifter 14 is made of spin-on-glass (SOG), for example. The refractive index of SOG is around 1.5.

Figure 6A:
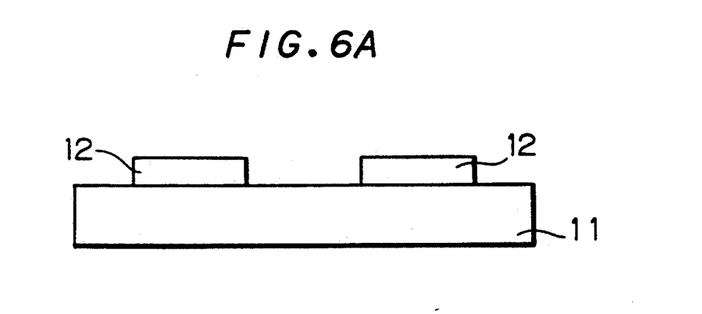
FIGS. 6A to 6C are cross sectional views showing a method of manufacturing a photomask according to an embodiment of the present invention.
Figure 6B:
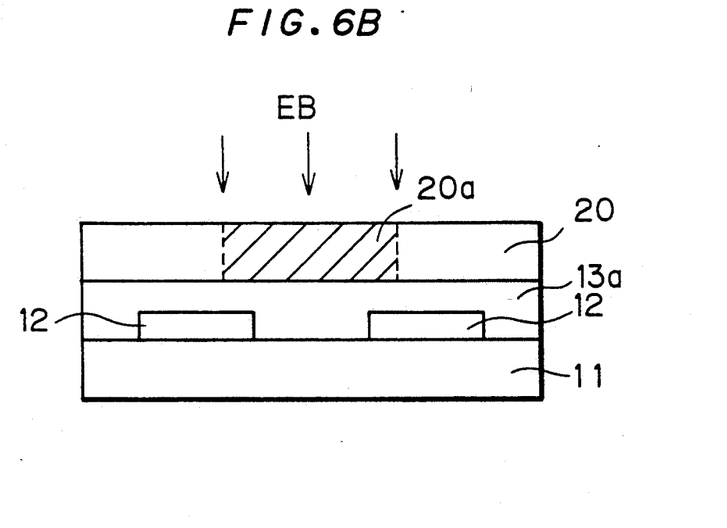
Figure 6C:
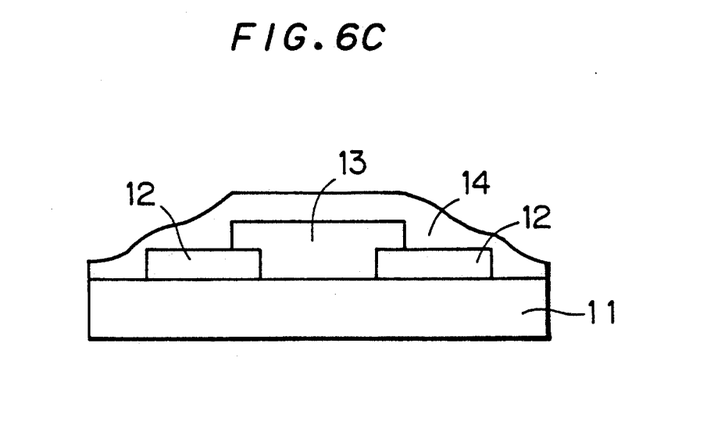

FIGS. 6A to 6C are cross sectional views showing the method of manufacturing a photomask according to the present embodiment. First, a chromium film is deposited on the transparent substrate 11 by a conventional technique such as spattering and electron-beam evaporation. The chromium film is selectively removed so that the light shielding layer 12 corresponding to the predetermined light shielding pattern 12p is formed (FIG. 6A).

Next, an SiO$_2$ film 13a is deposited by a conventional technique such as chemical vapor deposition so that it entirely covers the light shielding layer 12 and the transparent substrate 11. On the SiO$_2$ film 13a, a resist film 20 which is positive for an E-beam is formed by spin coat. Following this, the resist film 20 is selectively exposed by E-beam to form a region 20a which corresponds to the shape of the phase shifter 13, as in FIG. 6B. The region 20a, which was exposed by E-beam, is then selectively removed by O$_2$ plasma etching, whereby a resist pattern is formed. The SiO$_2$ film 13a is etched away by reactive ion etching with the resist pattern as a mask. As a result, the phase shifter 13 is formed.

The resist pattern is thereafter removed by O$_2$ plasma assisted etching. After removing the resist pattern, the intermediate phase shifter 14 is formed entirely on the transparent substrate 11, the light blocking layer 12 and the phase shifter 13.

Now, functions of the photomask 100a will be described. First, the photomask 100a is mounted to the exposure device of FIG. 2 and a light source 200 is turned on so that light from the light source 200 impinges on the photomask 100a through a lens 300. The light entering the photomask 100a is partially transmitted in uncoated regions where the light shielding layer 12 is not provided. The transmitted light is then guided onto a wafer 500 by a lens 400. On the other hand, light impinging on the light shielding layer 12 through the intermediate phase shifter 14 is blocked. Thus, a pattern which corresponds to the pattern 12a of the light shielding layer 12 is transmitted onto the wafer 500.

Figure 7:
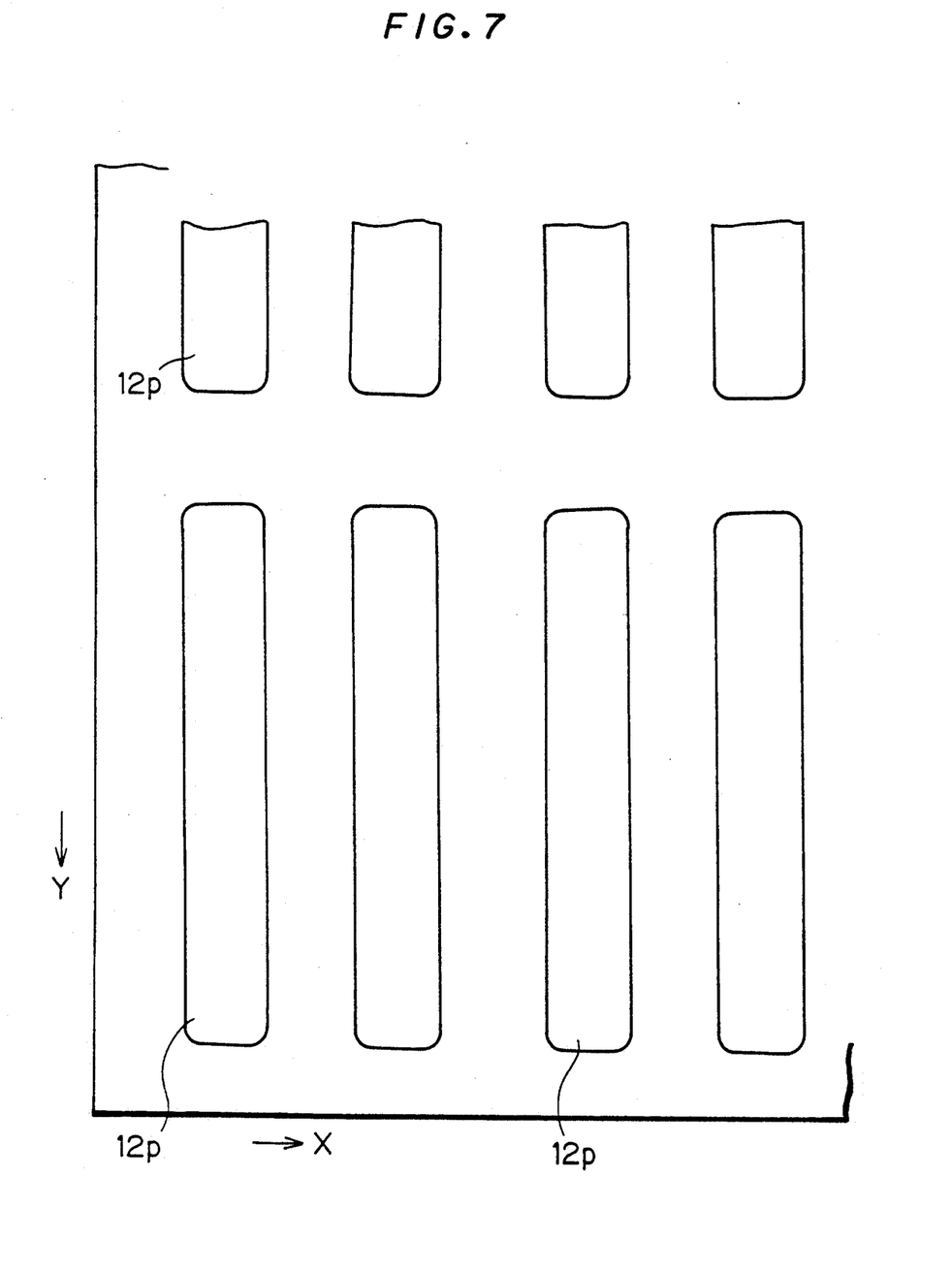
FIG. 7 is a plan view of patterns transmitted onto a wafer by using the photomask of FIG. 5A.
Figure 8:
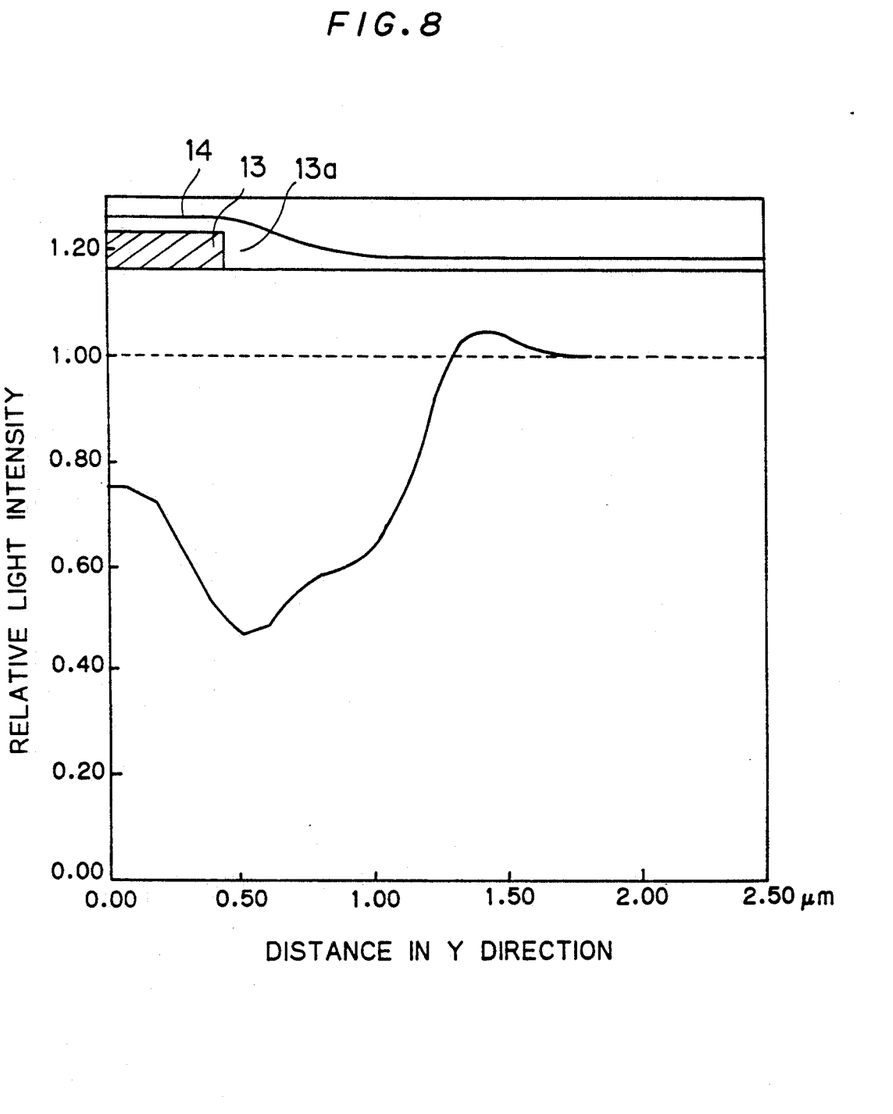
FIG. 8 is a graph showing relative light intensity along the Y—Y line of FIG. 5B.

FIG. 7 is a plan view of a pattern printed on the wafer 500 in the above manner. As can be readily understood, the printed pattern has good contrast with respect to the X direction due to enhanced X-direction resolution, which effect is similar to the conventional pattern transmission. With respect to the Y direction, a bridge has not resulted because of the intermediate phase shifter 14. The intermediate phase shifter 14 of SOG, which is viscos liquid, has a sloping thickness over a boundary area 13a, or the edge of the phase shifter 13 and a region around the same. The boundary area 13a causes light to be continuously phase-shifted from 0° to 180°, a intermediate phase area being thereby created. As a result, light intensity does not decrease to zero but has a relatively large value on the wafer 500 in a region which corresponds to the area 13a (FIG. 8), preventing a bridge to be formed on the wafer 500. Thus, the printed pattern has a desirable shape with respect to the Y direction as well.

The foregoing description has described that the intermediate phase shifter 14 is made of SOG. However, the intermediate phase shifter 14 may be made of other materials such as CYTOP, available from ASAHIGARASU KABUSIKI KAISHA, Tokyo, Japan. The refraction index of CYTOP is also about 1.5.

While the invention has been shown and described in detail, the foregoing description is in all aspects illustrative and not restrictive. It is understood that numerous modifications and variations can be devised without departing from the scope of the invention.

What is claimed is:

1. A method of manufacturing a photomask, said method comprising the steps of:
   (a) preparating a transparent substrate having two major surfaces;
   (b) selectively coating one major surface of said transparent substrate with two light shielding layers which are separated from each other, to thereby define an uncoated region of said transparent substrate, said uncoated region being between said two light shielding layers;
   (c) providing a phase shifter on said uncoated region such that said light shielding layers and said phase shifter are alternately arranged in a first direction; and
   (d) forming an intermediate shifter to overlie said transparent shifter, said light shielding layers and said phase shifter such that a thickness of said intermediate shifter gradually changes in a region of a border between the phase shifter and the transparent substrate, the thickness gradually changing in a second direction perpendicular to the first direction.

2. The method of claim 1, wherein the step (b) comprises the steps of:
   (b-1) depositing a light shielding film on said major surface of said transparent substrate; and
   (b-2) selectively removing said light shielding film.

3. The method of claim 2, wherein the step (b-1) includes the step of forming said light shielding film made of chromium by spattering evaporation.

4. The method of claim 2, wherein the step (b-1) includes the step of forming said light shielding film made of chromium by electron-beam evaporation.

5. The method of claim 1, wherein the step (c) comprises the steps of:
   (c-1) providing a silicon dioxide on said transparent substrate and said light shielding layers;
   (c-2) entirely covering said silicon dioxide with resist film;
   (c-3) exposing said resist film by electron beam to form an exposed region which corresponds to the shape of said phase shifter;

(c-4) selectively removing said resist film, to thereby form a resist pattern; and (c-5) selectively etching said silicon dioxide film with said resist pattern as a mask, whereby said phase shifter made of silicon dioxide is formed.

6. The method of claim 1, wherein the step (d) comprises the step of coating said intermediate shifter which is viscous liquid.

7. The method of claim 6, wherein said intermediate shifter is made of spin-on-glass.

* * * * *